United States Patent
Bhanumathi et al.

(10) Patent No.: US 6,348,160 B1
(45) Date of Patent: Feb. 19, 2002

(54) FERROELECTRIC CERAMIC MATERIAL WITH STRONG PIEZOELECTRIC PROPERTIES AND A PROCESS OF PREPARING THE SAME

(75) Inventors: Akella Bhanumathi; Vakkalanka Venkata Narasimhacharya; Kodidasu Umakantham, all of Visakhapatnam (IN)

(73) Assignee: Department of Science & Technology, New Delphi (IN)

( * ) Notice: Subject to any disclaimer, the term of this patent is extended or adjusted under 35 U.S.C. 154(b) by 0 days.

(21) Appl. No.: 09/586,215

(22) Filed: Jun. 2, 2000

(30) Foreign Application Priority Data

Jun. 3, 1999 (IN) .................................................. 833/99

(51) Int. Cl.$^7$ ........................................... C04B 35/495
(52) U.S. Cl. .................. 252/62.9 R; 501/134; 501/135; 264/618; 264/438
(58) Field of Search ...................... 252/62.9 R; 501/134, 501/135; 264/618, 438

(56) References Cited

U.S. PATENT DOCUMENTS

| 2,729,757 A | 1/1956 | Goodman ....................... 310/8 |
| 2,805,165 A | 9/1957 | Goodman ....................... 106/39 |
| 3,995,179 A | 11/1976 | Flournoy et al. ............ 310/8.2 |
| 4,234,558 A | 11/1980 | Arendt et al. ................. 423/593 |
| 5,747,672 A | 5/1998 | Parent et al. ............... 73/61.79 |
| 5,762,816 A | * 6/1998 | Kimura et al. .......... 252/62.9 R |

OTHER PUBLICATIONS

Jaffe, et al., *Piezoelectric Ceramics*, Academic Press London and New York, pp. 220–222 (1971) No Month.
Neurgaonkar, et al., Piezoelectric and Ferroelectric Properties of La–Modified and Unmodified Tungsten Bronze $Pb_{0.6}Ba_{0.4}Nb_2O_6$ Dense Ceramics, Mat. Res. Bull., 26(8):771–777 (1991) No Month.

Baxter, et al., Electrical Properties of Lead–Barium Niobates and Associated Materials, Journal of The American Ceramic Society, 43(11):578–583, Nov. 1960.

Nagata, et al., Properties of Grain–Oriented Transparent (Pb, Ba, La)$Nb_2O_6$ Ceramics, Japanese Journal of Applied Physics, 22(22–2):123–125 (1983) No Month.

Nagata, et al., Electrical Properties of Grain–Oriented Ba and La Modified Lead Niobate Ceramics from Molten Salt Synthesized Powders, Japanese Journal of Applied Physics, 24(24–3):100–102 (1985) No Month.

Francombe, The Relation between Structure and Ferroelectricity in Lead Barium and Barium Stontium Niobates, Acid. Cryst. 13:131 (1960) No Month.

Mason, Phy. Rev. 74, 1134 (1948), 30–55, 288–293 No Month.

* cited by examiner

*Primary Examiner*—C. Melissa Koslow
(74) *Attorney, Agent, or Firm*—Needle & Rosenberg, P.C.

(57) ABSTRACT

The present invention relates to the preparation of compositions and/or ferroelectric ceramic materials having niobate anions in combination with lead, barium, lanthanum, and bismuth cations. In preferred embodiments, the compositions comprised the formula $Pb_{(x-3y/2-3z/2)}Ba_{(1-x)}La_yBi_zNb_2O_6$, wherein x is from about 0.4 to about 0.6, y is from about 0.01 to about 0.03, and z is from about 0.01 to about 0.03. The compositions may be easily poled, and have unexpectedly high piezoelectric charge coefficients and unexpectedly high dielectric constants. The invention also provides processes for preparing the compositions, ferroelectric ceramic materials, and articles comprising the ferroelectric ceramic materials.

20 Claims, No Drawings

FERROELECTRIC CERAMIC MATERIAL WITH STRONG PIEZOELECTRIC PROPERTIES AND A PROCESS OF PREPARING THE SAME

This application claims the benefits of and priority to Indian Patent Application No. 833/Del/99, filed Jun. 3, 1999, which status is pending, and is hereby incorporated by reference in its entirety.

BACKGROUND OF THE INVENTION

1. Field of the Invention

This invention relates to compositions having niobate anions and a combination of lead, barium, lanthanum, and bismuth cations. These compositions are part of the Tungsten Bronze class of ferroelectric ceramic materials, and may have very high piezoelectric charge coefficients, $d_{33}$, and high dielectric constants. The invention also relates to processes of preparing the compositions, and ferroelectric ceramic materials and articles comprising the composition.

2. Background Art

When barium is partly substituted for lead in lead metaniobate, there is morphotrophic phase boundary at barium concentrations of about 0.4. In fact Francombe has shown (*Acta Cryst.* 13, 131–40 (1960)) that for barium concentration of 0.375 to 0.475, a mixed phase of tetragonal and orthorhombic structure occur. Subbarao et al. reported extensive work on substituted lead metaniobate, (*J. chem. Phys.* 32, 1846–51 (1960)). Pioneering work on hot pressed lead barium lanthanum niobate (PBLN) was done by Nagata, Okazaki et al. In this ceramic, grains are needle shaped and oriented parallel to c-axis.

Baxter and Hellicar (*J. Am Ceram Soc.* 43, 578–83 (1960)) prepared lead barium niobates and studied their electrical properties. They found that the structure of $Pb_xBa_{(1-x)}Nb_2O_6$ is orthorhombic for Barium content in the range 0–0.4 and the Curie temperature decreases for the same range of composition. With further increases of barium content, the structure become tetragonal and Curie temperature again rises. Mechanical $Q_m$ is 5 and 8 for barium contents between about 0 and 0.4, and as barium content increases, there is a sharp increase of $Q_m$ to 1000. There is a morphotrophic phase boundary between the orthorhombic and tetragonal structures at barium concentrations of about 0.4.

Substitution of barium for lead in $PbNb_2O_6$ decreases the orthorhombic distortion and then induces a tetragonal structure with polar axis along 'c' rather than orthorhombic 'b' (See Francombe, *Acta Cryst.* 13,131–40 (1960); Lewis and Thomas, *Proc. Internet. Conf. Solid State Phys. Electronics Telecommun.*, Brussels 4, Pt. 2, 883–90 (1958, Publ. 1960); Isupov, and Kosiakov, *Zh. Tekh. Fiz.* 28, 2175–85 and *Soviet Phys.—Tech. Phys.* 3, 2002–10 (1958); Goodman, G,. Am.Ceram. Soc. Bull. 34, No. 4, Program 11 (1955); U.S. Pat. Nos. 2,805,165; and 2,729,757). The substitution of substantial amounts of barium in lead niobate, $PbNb_2O_6$, causes remarkable change in ferro-electric properties. Greatly enhanced dielectric and piezoelectric properties are observed, as the barium content approaches 0.4.

During 1983, Nagata et al. studied the electric properties of hot-pressed $(Pb_xBa_{1-x})_{1-3y/2}La_yNb_2O_6$, (see Japanese Journal of Applied Physics, Vol. 22 Supplement 22-2, pp 123–125 (1983); and Japanese Journal of Applied Physics, Vol. 24 Supplement 24-3, pp 100–102 (1985)). They found that $k_t$ increases on tetragonal side up to x/y=60/4 and the maximum value of $k_t$ is 0.4. In the orthorhombic x/y=80/4 side $k_t$ decreases, the value of Q is 6, 12 and is low. Further, in the orthorhombic side, when x/y=65/4 and 70/4 remnant polarization $P_r$ attains maximum value of 10.

Nagata et al, in 1985 prepared PBLN by molten salt synthesis and found the maximum value of $k_t$=0.36 and lowest $Q_m$=30 and they concluded that the needle shaped PBLN prepared by molten salt synthesis become smaller in size and shorter in length with increase in and Lanthanum substitution. They concluded that with introduction of Lanthanum grain orientation fades as length to diameter ratio of grains decreases.

Neurogoankar et.al. studied hot pressed samples of $Pb_{0.6}Ba_{0.4}Nb_2O_6$ with or without Lanthanum (See Mat. Res.Bull. Vol. 26, pp. 771–777, 1991). It was found that the value of $P_s$ (spontaneous polarization)=is 10.9 $\mu c/cm^2$ in PBN: 60/6 and 23.6 $\mu c/cm^2$ in PBN. They reported $d_{33}$ values of $275 \times 10^{-12}$ C/N in PBLN 60/6 and $236 \times 10^{-12}$ C/N in PBN 60.

In all previous works, whenever a dopant was substituted, it was substituted both in lead and barium sites. Poling of these ceramics caused problems due to a decrease of resistance at high temperature.

SUMMARY OF THE INVENTION

The object of this invention is to prepare compositions and/or ceramic materials having strong piezoelectric and/or ferroelectric properties of the tungsten bronze type class of ceramic materials, which can be poled easily.

To achieve the said objective, in one embodiment the invention relates to compositions having $Nb_2O_6^{2-}$ anions (niobate anions) in combination with lead, barium, lanthanum, and bismuth cations.

In a preferred embodiment, the invention relates to compositions of the general formula $Pb_{(x-3y/2-3z/2)}Ba_{(1-x)}La_yBi_zNb_2O_6$, wherein x is preferably from about 0.4 to about 0.6, y is preferably from about 0.01 to about 0.03 and z is preferably from about 0.01 to about 0.03.

The above-described compositions may be easily poled, to provide piezoelectric and/or ferroelectric ceramic materials, that preferably have high piezoelectric charge coefficients, i.e. high $d_{33}$ values and/or high dielectric constants.

The instant invention further relates to processes for preparing ferroelectric ceramic materials of general formula $Pb_{(x-3y/2-3z/2)}Ba_{(1-x)}La_yBi_zNb_2O_6$, wherein x is preferably from about 0.4 to about 0.6, y is preferably from about 0.01 to about 0.03 and z is preferably from about 0.01 to about 0.03, and articles comprising the ferroelectric materials.

DETAILED DESCRIPTION OF THE INVENTION

In one embodiment, the invention relates to compositions having $Nb_2O_6^{2-}$ anions (niobate anions) in combination with lead, barium, lanthanum, and bismuth cations.

In a preferred embodiment, the invention relates to compositions of the general formula $Pb_{(x-3y/2-3z/2)}Ba_{(1-x)}La_yBi_zNb_2O_6$, wherein x is preferably from about 0.4 to about 0.6, y is preferably from about 0.01 to about 0.03 and z is preferably from about 0.01 to about 0.03. In more preferred embodiments, x is about 0.6, y is about 0.02, and z is about 0.02. In other more preferred embodiments, x is about 0.6, y is about 0.02, and z is about 0.03. Preferred compositions of the invention also include $Pb_{0.54}Ba_{0.4}La_{0.02}Bi_{0.02}Nb_2O_6$ and $Pb_{0.525}Ba_{0.4}La_{0.2}Bi_{0.03}Nb_2O_6$.

The compositions of the invention may be poled, to provide piezoelectric and/or ferroelectric ceramic materials.

Alternatively, the compositions may be formed into articles, then poled, to provide piezoelectric and/or ferroceramic articles. The ferroelectric ceramic materials and/or articles of the invention may be formed into articles that are surprisingly easily poled, i.e. the microscopic domains of the material and/or article may be re-oriented in a desired direction, preferably by applying a d.c. electric field to the material. The ferroelectric ceramic materials and/or articles exhibit unexpectedly high piezoelectric charge coefficients, i.e. high $d_{33}$ values, that may be greater than about 300 pc/N.

The invention also provides processes for preparing the piezoelectric and/or ferroelectric ceramic materials and/or articles. The articles are useful as components of ultra-sonic transducers.

In one embodiment, the processes for preparing $Pb_{(x-3y/2-3z/2)}Ba_{(1-x)}La_yBi_zNb_2O_6$ comprise doping $Pb_xBa_{(1-x)}Nb_2O_6$ with Bi and La in place of lead only, wherein the barium sites are left undisturbed, leading to tightly packed structure resulting in an improved piezoelectric material with high $d_{33}$ value.

In preferred embodiments of processes of the invention, the ferroelectric ceramic materials of the invention are prepared by calcining oxides or carbonates of Pb and Ba and oxides of La, Bi, and Nb in predetermined proportions, at high temperatures. The oxides of Pb, Ba, La, Bi, and/or Nb may include any oxide or carbonate compound containing one or more metals, salts or oxides comprising Pb, Ba, La, Bi, and/or Nb.

Preferably, the compositions and ferroelectric ceramic materials are prepared by calcining mixtures of metal oxide or carbonate compounds, wherein the oxide of Pb is PbO, the oxide of Ba $BaO_3$, the oxide of La is $La_2O_3$, the oxide of Bi is $Bi_2O_3$ and the oxide of Nb is $Nb_2O_5$. The carbonates of Pb is $PbCO_3$ and the carbonate of Ba is $BaCO_3$, and the carbonate of La is $LaCO_3$, Preferably, the oxides or carbonates of Pb and Ba and oxides of La, Bi, and Nb employed in the processes are high purity compounds. Even more preferably, the oxides or carbonates of Pb and Ba and oxides of La, Bi, and Nb are analytical reagent grade materials.

The oxides or carbonates of Pb and Ba and oxides of La, Bi, and Nb are combined in predetermined molar proportions, so as to produce the desired compositions and/or ferroelectric ceramic materials of the invention, i.e. $Pb_{(x-3y/2-3z/2)}Ba_{(1-x)}La_yBi_zNb_2O_6$. In these compositions, x is preferably from about 0.4 to about 0.6, y is preferably from about 0.01 to about 0.03, and z is preferably from about 0.01 to about 0.03. Preferably, the predetermined molar proportions of the oxides of Pb, Ba, La, Bi, and Nb are about the same as the molar proportions of Pb, Ba, La, Bi, and Nb in the product of the process, i.e., $Pb_{(x-3y/2-3z/2)}Ba_{(1-x)}La_yBi_zNb_2O_6$. Nevertheless, it is to be understood that some variations in the proportions of the oxides of Pb, Ba, La, Bi, and Nb combined may be required in order to produce a final product of the desired composition. For example, at the high temperatures of calcining, PbO can be volatilized, and therefore lost from the product. Therefore, PbO may optionally be combined in the form of a 4–6% molar excess of PbO, to compensate for PbO evaporation during firing or calcining.

In preferred embodiments of the above-described processes, analytical reagent grade metal oxides are employed. In preferred embodiments, the oxides are dry ground for 4–6 hours before calcining.

Calcining comprises heating the oxides or carbonates of Pb and Ba and oxides of La, Bi, and Nb at a temperature and for a time sufficient to form the desired products. Preferably, the calcining occurs at a temperature of about 800–900° C. Preferably, the calcining occurs over a time period from about 2 to about 6 hours.

The compositions and/or ferroelectric ceramic materials of the invention, produced by the above-described processes, may be processed to produce articles comprising the ferroelectric ceramic materials. Preferred processes for preparing the article comprises:

cooling the composition that results from the above-described calcining step and grinding it and mixing it with a binder to form pellets, sintering the pellets in presence of air to form a sintered article, applying a silver-containing composition to the surface of the sintered article and firing, and poling the sintered article.

In preferred embodiments of processes for preparing the article, the grinding, of the composition is carried out in presence of an alcohol solvent, preferably methanol. The ground product is mixed with a binder to form pellets. Preferred binders comprise organic polymers. Polyvinyl alcohol is a preferred binder. The pellets are then shaped, molded, or compressed to form articles. The articles of the invention may be any shape that may be suitable for the intended application of the article, such as a disk.

Sintering is carried out at an elevated temperature, and for a time effective to form the sintered article. Preferably, the temperature of sintering is above about 1000° C., and more preferably from about 1250 to about 1280° C. The time required for effective sintering varies with composition, temperature, and other variables, but determining effective times requires only routine experimentation within the average level of skill in the art. Preferably, when the temperature is from about 1250 to about 1280° C., the sintering time is from about 1 to about 1½ hrs.

In preferred embodiments of the processes of the invention, analytical reagent grade oxides are calcined at 800° C. for 6 hours and the pellets are sintered in air at 1280° C., for 1 hour, to form discs.

The compositions, the ceramic materials, and the sintered articles may be poled, to re-orient the domains of the ceramic material, preferably by exposing the article to a d.c. electric field.

Preferably, poling is preceded by polishing the surfaces of the article, then applying a silver-containing composition to one or more surfaces of the article and firing, to coat the surface of the article with metallic silver. Preferably, the article is coated with the silver-containing composition on two or more sides. The silver-containing composition preferably comprises a paste containing silver oxide, which is at least partially converted to metallic silver on the surface of the article by firing and/or heating the article to temperatures of approximately 500° C. for time periods of time effective to at least partially convert the silver oxide to metallic silver. Preferably, the article is heated at temperatures up to 500° C. for 15–20 minutes.

A preferred method of poling is by corona discharge, employing an electric field. Preferably, the poling is conducted at 120–130° C., using an electric field from about 35 to about 46 KV/cm, for from about 25 to about 35 min. In certain preferred embodiments, articles are poled by corona discharge at 125° C. with an electric field of 40 KV/cm for 30 min.

The invention will now be described with reference to the following example:

EXAMPLE

Taking the analytical reagent grade oxides of Pb, Ba, La, Bi and Nb in the proportion of one tenth of their molecular weights. Adding 5% excess of PbO in the said mixture. Calcining the said oxides mixtures at 800° C. for 2 hours. Cooling the resultant product and grinding it and mixing it with Polyvinyl Alcohol to form pellets. The said pellets were sintered in presence of air at 1250° C. for one hour to form sintered discs. The said discs were polished and silver paste is applied on both sides of the discs. Poling the said silver discs by Corona discharge at 125° C. with an electric field of 40KV/cm for 30 minutes to get the required piezoelectric materials such as $Pb_{0.54}Ba_{0.4}La_{0.02}Bi_{0.02}Nb_2O_6$ (AU I) and $Pb_{0.525}Ba_{0.4}La_{0.02}Bi_{0.03}Nb_2O_6$ (AU II). The said materials yield very high $d_{33}$ values of the order of $364 \; 10^{-12}$ C/N and $303 \; 10^{-12}$ C/N respectively along with high $k_p$ values of the order of 0.35.

Dielectric measurements were performed with an HP 4192 LF impedance analyzer at 1kHz frequency. Coupling factors were measured by the resonance method using the impedance analyser. The planar coupling factor, $k_p$, was calculated from the resonance and anti-resonance frequencies of a thin disc following the procedures described by Mason (Phy. Rev. 74 1134 (1948)). The thickness coupling factor $k_t$ was calculated from the ratio of the overtone frequency f2 to the fundamental frequency f1 of the series-mode resonance. The $d_{33}$ values were measured with a Sensor 0643 piezo-d-meter. The results of the samples AU(I) and AU(II) are given in Table I:

We have compared our values with the commercial samples marketed as modified $PbNb_2O_6$ in Table II, given below. It is seen that our samples exhibit unexpectedly high $d_{33}$ values in comparison to the known commercial samples. Further, it is seen that $k_p$ is negligible in commercial samples whereas our samples exhibit reasonably high values of $k_p$ (the planar coupling coefficient) and $k_t$ (the thickness coupling coefficient). Further, $Q_m$, (the mechanical quality factor) has also increased in our samples when compared to the commercial samples. Dielectric constant $\epsilon_{rt}$, is also very unexpectedly high in our samples.

We have achieved high $d_{33}$ values without using costly hot pressed techniques.

TABLE II

Comparative Statement Of Our Values With Commercial Samples Of Some International Companies

| SN | Company | $\epsilon_n$ | $d_{33}$ pc/N | $g_{33}$ mv/N | $k_t$ | $k_p$ | $Q_m$ | Tc (° C.) |
|---|---|---|---|---|---|---|---|---|
| 1. | EBL (1 LM) | 300 | 85 | 35 |  | — | 15 | 450 |
| 2. | EBL (4 LM) | 700 | 160 | 26 |  | — | 15 | 400 |
| 3. | Vernitron (pmn1) | 275 | 65 | 27 |  | — | 15 | 495 |
| 4. | Vernitron (pmn2) | 240 | 70 | 32 |  | — | 10 | 450 |
| 5. | EDO Westron (EC-82) | 240 | 75 | 35 |  | — | 11 | 400 |
| 6. | Sensor (13M-900) | 300 | 75 | 35 | 0.35 | — | 15 | 490 |
| 7. | Andhra University (AU-1) | 2095 | 364 | 2.1 | 0.25 | 0.35 | 110 | 185 |
| 8. | Andhra University (AU-II) | 2076 | 303.4 | 16.5 | 0.15 | 0.39 | 77 | 173 |

The reason why the Pr values are low and Ec values are high could be explained as follows: The possibility of Lanthanum squeezing into Nb place cannot be ruled out. One of the octahedral holes present in close packed arrays is the one created exclusively by oxide ions. This void can accommodate cations with radii ranging from 0.58 A° to 1.02 A°. In View of the fact that La with coordination number 6 has an ionic radii of 1.032 A° it is possible for La to get squeezed into the oxide cage, i.e. into B site. In perovskite PLZT it has been shown that a small fraction of doped La could get into oxide ion octahedral holes, in which case it would act as a hard dopent. This is supported by hysteresis behaviour of AU(I) and AU(11) where lower Pr and high Ec is obtained.

CONCLUSION

Samples of the ferroelectric ceramic materials of the invention, produced by the methods of the invention (i.e. AU(I) and AU(II)) exhibit much higher $d_{33}$ values when compared with commercial lead Niobate samples. There is

TABLE I

| Sample | Tc (° C.) | $\epsilon_{rt}$ | $\epsilon_{tc}$ | $k_p$ | $k_t$ | $d_{31}$ | $d_{33}$ pc/N | $Q_m$ | $P_r^2$ $\mu c$/cm | $E_c$ kV/cm |
|---|---|---|---|---|---|---|---|---|---|---|
| AU(I) | 185 | 3488 | 9148 | 0.35 | 0.25 | 68 | 364 | 110 | 10 | 10.8 |
| AU(II) | 173 | 3152 | 7184 | 0.39 | 0.15 | 98 | 303.4 | 77 | 12 | 11.2 |

From the results it can be concluded that with increase in Bismuth concentration from 0.02 to 0.03, there is slight decrease in $d_{33}$ and substantial decrease in $Q_m$.

a drastic decrease in Qm with increase in Bismuth content. AU(I) and AU(II) exhibit high $k_p$ values. In conclusion, it can be said that the Lead barium niobate family has potentially important applications and may surpass PZT (lead zirconium titanate) for particular applications such as undersea ultrasonic transducers.

Throughout this application, various publications are referenced. The disclosures of these publications in their entireties are hereby incorporated by reference into this application in order to more fully describe the state of the art to which this invention pertains.

It will be apparent to those skilled in the art that various modifications and variations can be made in the present invention without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A composition having the formula $Pb_{(x-3y/2-3z/2)}Ba_{(1-x)}La_yBi_zNb_2O_6$, wherein x is from about 0.4 to about 0.6, y is from about 0.01 to about 0.03, and z is from about 0.01 to about 0.03.

2. The composition of claim 1, wherein x is about 0.6, y is about 0.02, and z is about 0.02.

3. The composition of claim 1, wherein x is about 0.6, y is about 0.02, and z is about 0.03.

4. A process of preparing a ferroelectric ceramic material, comprising:
   a) calcining oxides or carbonates of Pb and Ba and oxides of La, Bi, and Nb to form a ceramic material comprising the composition $Pb_{(x-3y/2-3z/2)}Ba_{(1-x)}La_yBi_zNb_2O_6$, wherein x is from about 0.4 to about 0.6, y is from about 0.01 to about 0.03, and z is from about 0.01 to about 0.03, and
   b) poling the ceramic material to provide the ferroelectric ceramic material.

5. The process of claim 4, wherein the oxide of Pb is PbO, the oxide of Ba is BaO, the oxide of La is $La_2O_3$, the oxide of Bi is $Bi_2O_3$, the oxide of Nb is $Nb_2O_5$, the carbonate of Ba is $BaCO_3$, and the carbonate of Pb is $PbCO_3$.

6. The process of claim 4, wherein the oxides or carbonates of Pb and Ba and oxides of La, Bi, and Nb, are combined in molar proportions of oxides or carbonates of Pb and Ba and oxides of La, Bi, and Nb that are about the same as the molar proportions of Pb, Ba, La, Bi, and Nb in the formula of the ceramic material $Pb_{(x-3y/2-3z/2)}Ba_{(1-x)}La_yBi_zNb_2O_6$ except at high temperature for the oxide or carbonate of Pb, which is combined in the form of a 4–6% molar excess of PbO or $PbCO_3$.

7. The process of claim 4, having a $d_{33}$ value of greater than about 300 pc/Newton.

8. A process of preparing a ferroelectric article, comprising:
   a) calcining oxides or carbonates of Pb and Ba and oxides of La, Bi, and Nb, to form a ceramic material comprising the composition $Pb_{(x-3y/2-3z/2)}Ba_{(1-x)}La_yBi_zNb2O6$, wherein x is from about 0.4 to about 0.6, y is from about 0.01 to about 0.03, and z is from about 0.01 to about 0.03,
   b) grinding the ceramic material and mixing it with a binder to form pellets,
   c) sintering the pellets in presence of air to form a sintered article,
   d) applying a silver-containinig composition to the surface of the sintered article, and firing, and
   e) poling the sintered article.

9. The process of claim 8, wherein the oxides or carbonates are dry ground for 4–6 hours before calcining.

10. The process of claim 8, wherein the oxide of Pb is PbO, oxide of Ba is Bao, oxide of Ba is $BaCO_3$, the oxide of La is $La_2O_3$, the oxide of Bi is $Bi_2O_3$, the oxide of Nb is $Nb_2O_5$ and the carbonate of Ba is $BaCO_3$, and the carbonate of Pb is $PbCO_3$.

11. The process of claim 8, wherein the oxides or carbonates of Pb and Ba and oxides of La, Bi, and Nb are combined in molar proportions of oxides or carbonates of Pb and Ba and oxides of La, Bi, and Nb that are about the same as the molar proportions of Pb, Ba, La, Bi, and Nb in the ceramic material $Pb_{(x-3y/2-3z/2)}Ba_{(1-x)}La_yBi_zNb_2O_6$, except at high temperature for the oxide or carbonate of Pb, which is combined in the form of a 4–6% molar excess of PbO or $PbCO_3$.

12. The process of claim 8, wherein the calcining occurs at a temperature of about 800–900° C., for 2–6 hours.

13. The process of claim 8, wherein the grinding of the ceramic material is carried out in presence of an alcohol.

14. The process of claim 13, wherein the alcohol is methanol.

15. The process of claim 8 wherein the binder is an organic polymer.

16. The process of claim 8, wherein the binder is polyvinyl alcohol.

17. The process of claim 8, wherein the sintering is conducted at 1250–1280° C. for 1–1½ hrs.

18. The process of claim 8, wherein the silver-containing composition is a paste comprising silver oxide.

19. The process of claim 8, wherein the poling comprises corona discharge with an electric field.

20. The process of claim 19, wherein the corona discharge is conducted at 120–130° C. for 25–35 min using an electric field of 35–46 KV/cm.

* * * * *